US008825967B2

(12) United States Patent
Hong Beom

(10) Patent No.: US 8,825,967 B2
(45) Date of Patent: Sep. 2, 2014

(54) INDEPENDENT WRITE AND READ CONTROL IN SERIALLY-CONNECTED DEVICES

(75) Inventor: Pyeon Hong Beom, Kanata (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 185 days.

(21) Appl. No.: 13/401,087

(22) Filed: Feb. 21, 2012

(65) Prior Publication Data

US 2013/0151757 A1 Jun. 13, 2013

Related U.S. Application Data

(60) Provisional application No. 61/568,275, filed on Dec. 8, 2011.

(51) Int. Cl.
*G06F 12/00* (2006.01)
(52) U.S. Cl.
USPC .................................. 711/154; 711/E12.008
(58) Field of Classification Search
None
See application file for complete search history.

(56) References Cited

U.S. PATENT DOCUMENTS

| | | | |
|---|---|---|---|
| 4,041,473 A | 8/1977 | Bardotti et al. | |
| 4,174,536 A | 11/1979 | Misunas et al. | |
| 4,434,459 A | 2/1984 | Holland et al. | |
| 4,573,147 A | 2/1986 | Aoyama et al. | |
| 4,617,566 A | 10/1986 | Diamond | |
| 4,679,173 A | 7/1987 | Sato | |
| 4,796,231 A | 1/1989 | Pinkham | |
| 4,899,316 A | 2/1990 | Nagami | |
| 5,038,299 A | 8/1991 | Maeda | |
| 5,132,635 A | 7/1992 | Kennedy | |
| 5,136,292 A | 8/1992 | Ishida | |
| 5,204,669 A | 4/1993 | Dorfe et al. | |
| 5,243,703 A | 9/1993 | Farmwald et al. | |

(Continued)

FOREIGN PATENT DOCUMENTS

WO 0169411 A2 9/2001
WO 2006036811 A2 4/2006

(Continued)

OTHER PUBLICATIONS

Gillingham, Peter B., Powerpoint Slides shown at JEDEC Future NAND Task Group Meeting: "NAND—ONF1 2.0—HL1 Comparison", 2 pages, Feb. 3, 2008.

(Continued)

*Primary Examiner* — Charles Rones
*Assistant Examiner* — Tian-Pong Chang

(57) ABSTRACT

A memory device, comprising a first control input port, a second control input port, a third control input port, a data input port, a data output port, an internal memory and control circuitry. The control circuitry is responsive to a control signal on the first control input port to capture command and address information via the data input port. When the command is a read command, the control circuitry is further responsive to a read control signal on the second control input port to transfer data associated with the address information from the internal memory onto the data output port. When the command is a write command, the control circuitry is responsive to a write control signal on the third control input port to write data captured via the data input port into the internal memory at a location associated with the address information.

54 Claims, 12 Drawing Sheets

(56) References Cited

U.S. PATENT DOCUMENTS

| | | |
|---|---|---|
| 5,319,598 A | 6/1994 | Aralis et al. |
| 5,336,951 A | 8/1994 | Josephson et al. |
| 5,384,735 A | 1/1995 | Park et al. |
| 5,404,460 A | 4/1995 | Thomsen et al. |
| 5,430,859 A | 7/1995 | Norman et al. |
| 5,452,259 A | 9/1995 | McLaury |
| 5,473,577 A | 12/1995 | Miyake et al. |
| 5,475,854 A | 12/1995 | Thomsen et al. |
| 5,596,724 A | 1/1997 | Mullins et al. |
| 5,602,780 A | 2/1997 | Diem et al. |
| 5,671,178 A | 9/1997 | Park et al. |
| 5,740,379 A | 4/1998 | Hartwig |
| 5,768,212 A | 6/1998 | Fujita |
| 5,771,199 A | 6/1998 | Lee |
| 5,778,419 A | 7/1998 | Hansen et al. |
| 5,802,399 A | 9/1998 | Yumoto et al. |
| 5,806,070 A | 9/1998 | Norman et al. |
| 5,828,899 A | 10/1998 | Richard et al. |
| 5,844,846 A | 12/1998 | Jang |
| 5,844,858 A | 12/1998 | Kyung |
| 5,859,809 A | 1/1999 | Kim |
| 5,872,994 A | 2/1999 | Akiyama et al. |
| 5,878,240 A | 3/1999 | Tomko |
| 5,938,750 A | 8/1999 | Shaberman |
| 5,941,974 A | 8/1999 | Babin |
| 5,959,890 A | 9/1999 | Yamamoto et al. |
| 5,964,857 A | 10/1999 | Srinivasan et al. |
| 6,002,638 A | 12/1999 | John |
| 6,064,627 A | 5/2000 | Sakurai |
| 6,075,728 A | 6/2000 | Inoue et al. |
| 6,081,860 A | 6/2000 | Bridges et al. |
| 6,091,660 A | 7/2000 | Sasaki et al. |
| 6,102,963 A | 8/2000 | Agrawal |
| 6,144,576 A | 11/2000 | Leddige et al. |
| 6,148,363 A | 11/2000 | Lofgren et al. |
| 6,148,364 A | 11/2000 | Srinivasan et al. |
| 6,215,726 B1 | 4/2001 | Kubo |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,449,213 B1 | 9/2002 | Dodd et al. |
| 6,477,618 B2 | 11/2002 | Chilton |
| 6,594,183 B1 | 7/2003 | Lofgren et al. |
| 6,658,509 B1 | 12/2003 | Bonella et al. |
| 6,680,904 B1 | 1/2004 | Kaplan et al. |
| 6,715,044 B2 | 3/2004 | Lofgren et al. |
| 6,763,426 B1 | 7/2004 | James et al. |
| 6,807,613 B1 | 10/2004 | Keeth et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,928,501 B2 | 8/2005 | Andreas et al. |
| 6,944,697 B2 | 9/2005 | Andreas |
| 6,950,325 B1 | 9/2005 | Chen |
| 6,965,539 B2 | 11/2005 | Lee |
| 6,996,644 B2 | 2/2006 | Schoch et al. |
| 7,031,221 B2 | 4/2006 | Mooney et al. |
| 7,032,039 B2 | 4/2006 | DeCaro |
| 7,058,776 B2 | 6/2006 | Lee |
| 7,111,085 B2 | 9/2006 | Estakhri et al. |
| 7,130,958 B2 | 10/2006 | Chou et al. |
| 7,177,170 B2 | 2/2007 | Gomm |
| 7,180,778 B2 | 2/2007 | Kawai et al. |
| 7,188,219 B2 * | 3/2007 | Jeddeloh ............. 711/154 |
| 7,194,581 B2 | 3/2007 | Vogt |
| 7,202,545 B2 | 4/2007 | Perner |
| 7,239,576 B2 | 7/2007 | Shimbayashi |
| 7,245,553 B2 | 7/2007 | Lin et al. |
| 7,254,663 B2 | 8/2007 | Bartley et al. |
| 7,290,091 B2 | 10/2007 | Savell et al. |
| 7,308,524 B2 | 12/2007 | Grundy et al. |
| 7,334,070 B2 | 2/2008 | Borkenhagen |
| 7,433,258 B2 | 10/2008 | Rao et al. |
| 7,515,471 B2 | 4/2009 | Oh et al. |
| 7,688,652 B2 | 3/2010 | Oh |
| 7,774,559 B2 | 8/2010 | Cronin et al. |
| 7,836,340 B2 | 11/2010 | Schuetz |
| 7,889,578 B2 | 2/2011 | Schuetz et al. |
| 7,894,294 B2 | 2/2011 | Pyeon |
| 2002/0188781 A1 | 12/2002 | Schoch et al. |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0148482 A1 | 7/2004 | Grundy et al. |
| 2004/0252689 A1 | 12/2004 | Park et al. |
| 2005/0073899 A1 | 4/2005 | Gallivan et al. |
| 2005/0138267 A1 | 6/2005 | Bains et al. |
| 2005/0160218 A1 | 7/2005 | See et al. |
| 2005/0166006 A1 | 7/2005 | Talbot et al. |
| 2006/0020740 A1 | 1/2006 | Bartley et al. |
| 2006/0031593 A1 | 2/2006 | Sinclair |
| 2006/0044872 A1 | 3/2006 | Nazarian |
| 2007/0038852 A1 | 2/2007 | Bovino et al. |
| 2007/0064629 A1 | 3/2007 | Regev et al. |
| 2007/0076479 A1 | 4/2007 | Kim et al. |
| 2007/0076502 A1 | 4/2007 | Pyeon et al. |
| 2007/0109833 A1 | 5/2007 | Pyeon et al. |
| 2007/0153576 A1 | 7/2007 | Oh et al. |
| 2007/0157000 A1 | 7/2007 | Qawami et al. |
| 2007/0165457 A1 * | 7/2007 | Kim ............. 365/185.11 |
| 2007/0233903 A1 | 10/2007 | Pyeon |
| 2007/0234071 A1 | 10/2007 | Pyeon |
| 2008/0016269 A1 | 1/2008 | Chow et al. |
| 2008/0019189 A1 | 1/2008 | Lin |
| 2008/0019196 A1 | 1/2008 | Lin |
| 2008/0049505 A1 | 2/2008 | Kim et al. |
| 2008/0052449 A1 | 2/2008 | Kim et al. |
| 2008/0080492 A1 | 4/2008 | Pyeon et al. |
| 2008/0144411 A1 | 6/2008 | Tsern |
| 2008/0155219 A1 | 6/2008 | Pyeon et al. |
| 2008/0198682 A1 | 8/2008 | Pyeon |
| 2008/0201496 A1 | 8/2008 | Gillingham |
| 2008/0201548 A1 | 8/2008 | Przybylski et al. |
| 2008/0205187 A1 | 8/2008 | Pyeon |
| 2008/0215778 A1 | 9/2008 | Sumi |
| 2008/0279003 A1 | 11/2008 | Kim et al. |
| 2009/0021992 A1 * | 1/2009 | Oh ............. 365/189.14 |
| 2009/0039927 A1 | 2/2009 | Gillingham et al. |
| 2009/0063786 A1 * | 3/2009 | Oh ............. 711/148 |
| 2009/0103378 A1 | 4/2009 | Schuetz et al. |
| 2009/0119464 A1 * | 5/2009 | Grundy et al. ............. 711/154 |
| 2009/0129184 A1 | 5/2009 | Schuetz |
| 2009/0154285 A1 | 6/2009 | Pyeon |
| 2009/0154629 A1 | 6/2009 | Pyeon et al. |
| 2009/0180483 A1 | 7/2009 | Przybylski |
| 2010/0011174 A1 | 1/2010 | Oh |
| 2010/0097874 A1 * | 4/2010 | Hoffmann ............. 365/222 |

FOREIGN PATENT DOCUMENTS

| | | |
|---|---|---|
| WO | 2007036047 A1 | 4/2007 |
| WO | 2007036048 A1 | 4/2007 |
| WO | 2007036050 | 4/2007 |
| WO | 2008022454 A1 | 2/2008 |
| WO | 2008067636 | 6/2008 |

OTHER PUBLICATIONS

Gjessing, S. et al, "A RAM Link for High Speed, Special Report/ Memory", IEEE Spectrum, Oct. 1992, 52-53.

Gjessing, Stein, "Performance of the Ramlink Memory Architecture", Proceedings of the Twenty-Seventh Annual Hawaii International Conference on System Sciences, IEEE 1060-3425/94, 154-162.

Gjessing, Stein et al, "Ramlink: A High-Bandwidth Point-To-Point Memory Architecture", Proceedings COMPCOM 1992, IEEE 0-8186-2655-0/92, 328-331, Feb. 24, 1992.

Diamond, Steven L., "Synclink: High-Speed DRAM for the Future", Micro Standards, IEEE Micro, Dec. 1996, 74-75.

IEEE Standard for High-Bandwidth Memory Interface Based on Scalable Coherent Interface (SCI) Signaling Technology (Ramlink),

(56) References Cited

OTHER PUBLICATIONS

IEEE STD. 1596.4-1996, The Institute of Electrical Electronics Engineers, Inc., 98 pages, Mar. 19, 1996.
Oshima, Y. et al, "High-Speed Memory Architectures for Multimedia Applications—Meeting the Requirements of Higher Performance", Circuits and Devices, IEEE 8755-3996/97, Jan. 1997, 8-13.
Choudhury, S., "International Patent Aplication No. PCT/CA2007/001789, Search Report", 47-50, Jun. 4, 2008.
Takeuchi, K. et al, A 56NM CMOS 99MM2 8GB Multi-Level NAND Flash Memory with 10MB/S Program Throughput, Solid-State Circuits, 2006 IEEE International Conference Digest of Technical Papers, Session 7, ISBN:1-4244-0079-1, 10 pages, Feb. 6, 2006.
"2GBIT (256 X 8 BITS) CMOS NAND E2PROM", TH58NVG1S3AFT05, Toshiba MOS Digital Integrated Circuit Silicon Gate CMOS, 1-32, May 19, 2003.
Atmel, "High Speed Small Sectored SPI Flash Memory 4M (524,288.8) AT25FS040 Advance Information", 1-23, Sep. 1, 2006.
Spansion, "64 Megabit CMOS 3.0 Volt Flash Memory With 50MHZ SPI (Serial Peripheral Interface) Bus Data Sheet (Preliminary) Publication No. S25FL064A", 32 pages, Sep. 6, 2006.
Intel Advanced Boot Block Flash Memory (C3), 28F800C, 28F160C3, 28F320C3(16) Datasheet Product Features Order No. 290645, Revision: 023, 1-72, May 1, 2005.
King, Craig, L. et al, "Communicating With Daisy Chained MCP42XXX Digital Potentiometers" Microchip AN747, 1-8, Jan. 30, 2001.
M-Systems Flash Disk Pioneers Ltd., "Diskonchip H1 4GB (512 Mbyte) and 8 GB (1 Gbyte) High Capacity Flash Disk With NAND and x2 Technology" Data Sheet, Rev. 0.5 (Preliminary), 1-66, Jan. 1, 2005.
"ONENAND TM Specification, Version 1.2", 1-125, Dec. 23, 2005.
"DDR2 Fully Buffered DIMM 240 PIN FBDIMMS Based on 512 MB C-DIE" (ROHS Compliant) Rev. 1.3, 1-32, Sep. 1, 2006.
"K9XXG08UXM Preliminary Flash Memory" Technical Specification, Samsung Electronics, 1-43, May 3, 2005.
Hypertransport TM IO Link Specification, Revision 3.00, Document No. HTC20051222-0046-0008, Hyperstransport Technology Consortium, 1-428, Apr. 21, 2006.

Gillingham, Peter, HLNAND: A New Standard for High Performance Flash Memory, Flash Memory Summit, Santa Clara, California, 1-18, Aug. 13, 2008.
"PowerPoint Slides shown at a technical conference in Santa Clara, CA, USA" HyperLink Q and A, 5 pages, Feb. 8, 2008.
Kennedy, Joseph et al, "A 2GB/S Point to Point Heterogeneous Voltage Capagle DRAM Interface for Capacity-Scalable Memory Subsystems" ISSCC 2004/ Session 1/ DRAM/ 11.8, IEEE International Solid-State Circuits Conference, 1-10, Feb. 15, 2004.
Hypertransport TM I/O Link Specification, Revision 2.00b, Document No. HTC20031217-0036-0010, Hyperstransport Technology Consortium, 1-325, Apr. 27, 2005.
Kim, Jae-Kwan et al, "A 3.6GB/S/PIN Simultaneous Bidirectional (SBD) I/O Interface for High-Speed DRAM" ISSCC 2004/Session 22/DSL and Multi-GB/s I/O 22.7, IEEE International Solid-State Circuits Conference, 1-8, Feb. 15, 2004.
8-Megabit 2.5 Volt Only or 2.7-Volt Only Data Flash, Technical Specification, Rev. 2225H-DFLSH-10/04, AT45DB081B, ATMEL; Corporation, Oct. 2004, 1-33.
The I2C-Bus Specification Version 2.1, Philips Semiconductors, Document Order No. 9398 393 40011, 1-46, Jan. 1, 2000.
"2 MBIT Low Voltage Serial Flash Memory With 40MHZ SPI Bus Interface", 1-40, Aug. 1, 2004.
NA, Microchip Product Description 24AA1025/24LC1025, 1024K 12CTM CMOS Serial EEPROM, 1-22, Feb. 16, 2006.
"16 MBIT SPI Serial Flash, SST25VF016B, Preliminary Specification", Silicon Storage Technology Inc., Apr. 2005, 1-28.
"Two-wire Serial EEPROM; 0180Y-SEEPR-2/06", 1-27, Jan. 1, 2006.
Atmel Corporation, "Atmel 8Mbit 2.7 volt Minimum SPI Serial Flash Memory", 1-40, Jun. 1, 2009.
Microchip Technology Inc., "Microchip's 1Mb I2C serial EEPROM Family Data Sheet", Jan. 1, 2007.
STMicroelectronics, "STMicroelectronics 2Mbit, low voltage, Serial Flash Memory device with 50 MHz SPI bus Interface", 1-50, Jun. 1, 2006.
Samsung Electronics Co., Ltd., "Samsung 4GB D Die NAND Flash Datasheet", 1-42, May 1, 2010.
Samsung Electronics Co. Ltd., "256 M x 8 Bit/ 128M x 16 Bit/ 512M x 8 Bit NAND Flash Memory", K9K4G08U1M, K9F2G08U0M, K9F2G16U0M, Revision 1.0, 1-41, May 6, 2005.

* cited by examiner

INDEPENDENT WRITE AND READ CONTROL IN SERIALLY-CONNECTED DEVICES

CROSS-REFERENCE TO RELATED APPLICATION

The present application claims the benefit under 35 U.S.C. 119(e) of U.S. Provisional Application Ser. No. 61/568,275 to Pyeon, filed on Dec. 8, 2011 and hereby incorporated by reference herein.

TECHNICAL FIELD

The present invention relates to semiconductor memory devices.

BACKGROUND

Devices, such as, for example, memory devices are often serially-connected. Operation of each of the serially-connected devices is controlled by a controller. In a case of the devices being memory devices, it is desirable to independently access each of the serially-connected devices.

SUMMARY

A first broad aspect of the invention seeks to provide a memory device, comprising a first control input port, a second control input port, a third control input port, a data input port, a data output port, an internal memory and control circuitry. The control circuitry is responsive to a control signal on the first control input port to capture command and address information via the data input port. When the command is a read command, the control circuitry is further responsive to a read control signal on the second control input port to transfer data associated with the address information from the internal memory onto the data output port. When the command is a write command, the control circuitry is responsive to a write control signal on the third control input port to write data captured via the data input port into the internal memory at a location associated with the address information.

A second broad aspect seeks to provide a method for execution by a memory controller connectable to a chain of serially-connected memory devices. The method comprises asserting a read data control signal to delimit a read data packet request (RDPR) destined for a first target memory device of the chain; and asserting a write data control signal to delimit a write data packet (WDP) destined for a second target memory device of the chain. In this second aspect, the RDPR and the WDP are of different lengths.

A third broad aspect seeks to provide a method for execution by a memory controller connectable to a chain of serially-connected memory devices. The method comprises asserting a read data control signal to delimit a read data packet request (RDPR) destined for a first target memory device of the chain; and asserting a write data control signal to delimit a write data packet (WDP) destined for a second target memory device of the chain. In this third aspect, the RDPR and the WDP are time interleaved with respect to one another.

A fourth broad aspect seeks to provide a memory device connectable to a next device of a chain, comprising: an input/output interface; an internal memory; and control circuitry. The control circuitry is configured to recognize a command received via the interface and destined for the memory device. When the command is a read command destined for the memory device, the control circuitry is further configured to: respond to a read control signal received via the interface by sending data from the internal memory towards the next device via the interface; and transfer a write control signal received via the interface towards the next device via the interface. When the command is a write command destined for the memory device, the control circuitry is further configured to: respond to a write control signal by writing data captured from the interface to the internal memory; and transfer a read control signal received via the interface towards the next device via the interface.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1A:
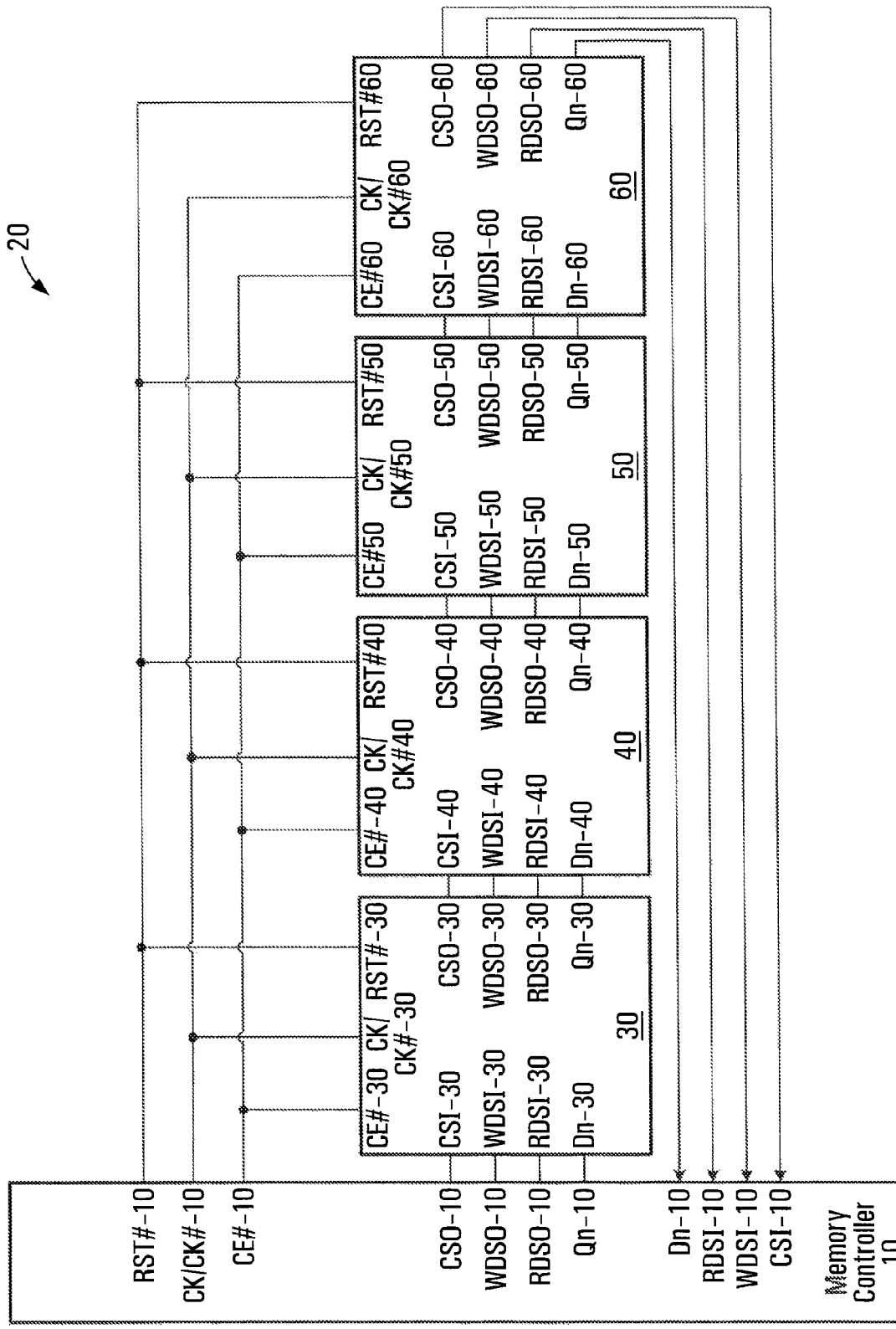
FIG. 1A is a block diagram of a memory system in which a memory controller is connected to a chain of memory devices.

Generally, certain embodiments of the present invention provide an architecture to independently control the writing and reading of data in a serial interconnection of semiconductor devices. Accordingly, with reference to FIG. 1A, there is shown a memory system, comprising a memory controller 10 and a chain (or ring) 20 of serially connected memory devices. The memory controller 10 may comprise a clock producer, control logic, interface circuitry and other elements that will allow it to perform the functionality described herein. The memory controller 10 may be connected (e.g., via a bus) to external circuitry (not shown) such as a processing unit associated with digital electronic equipment (e.g., camera, mobile phone, portable computer, e-book reader, etc). The chain 20 of serially connected memory devices includes a first memory device 30, zero or more intermediate memory devices 40, 50 and a last memory device 60. In the illustrated embodiment, two intermediate memory devices are shown, namely a first intermediate memory device 40 and a second intermediate memory device 50. However, it is to be understood that the number of intermediate memory devices is not particularly limited.

The memory system implements a multiplexed serial bus architecture to transfer information such as commands, addresses and data through a series of links between adjacent pairs of the memory devices 30, 40, 50, 60. Accordingly, the memory controller 10 and each of the memory devices 30, 40, 50, 60 is provided with an input/output interface, which includes a plurality of ports carrying respective signals. Specifically, a particular memory device comprises a plurality of input ports carrying respective input signals along a link leading from a previous device, as well as a plurality of output ports carrying respective output signals along a link leading to a next device. The aforementioned ports and signals will now be described in further detail.

From the perspective of the first memory device 30, there is provided serial data input port Dn-30 and serial data output port Qn-30, each of which can include one or more pins. Serial data input port Dn-30 carries a data signal $S_D$-30, which emanates from serial data output port Qn-10 of the memory controller 10 as a data signal $S_D$-30. For its part, serial data output port Qn-30 carries a data signal to serial data input port Dn-40 of the next memory device in the chain 20, namely the first intermediate memory device 40. In the case where serial data input port Dn-30 and serial data output port Qn-30 include a plurality of data input and output pins, respectively, the value "n" refers to the set of pins that are actually used for communication, known as the "current link width". Thus, n∈{0} for a 1-bit current link width; n∈{0, 1} for a 2-bit current link width; n∈{0, 1, 2, 3} for a 4-bit current link width; n∈{0, 1, 2, 3, 4, 5, 6, 7} for an 8-bit current link width; etc. The "current link width" used by a particular device may be programmed through a link configuration register to utilize 1, 2, 4, or 8 of the device package's available data input and output pins (known as the "maximum link width"). This feature allows the first memory device 30 to operate in a chain with other memory devices that have smaller or larger maximum link widths, provided they are all programmed to use the same current link width.

Figure 1B:
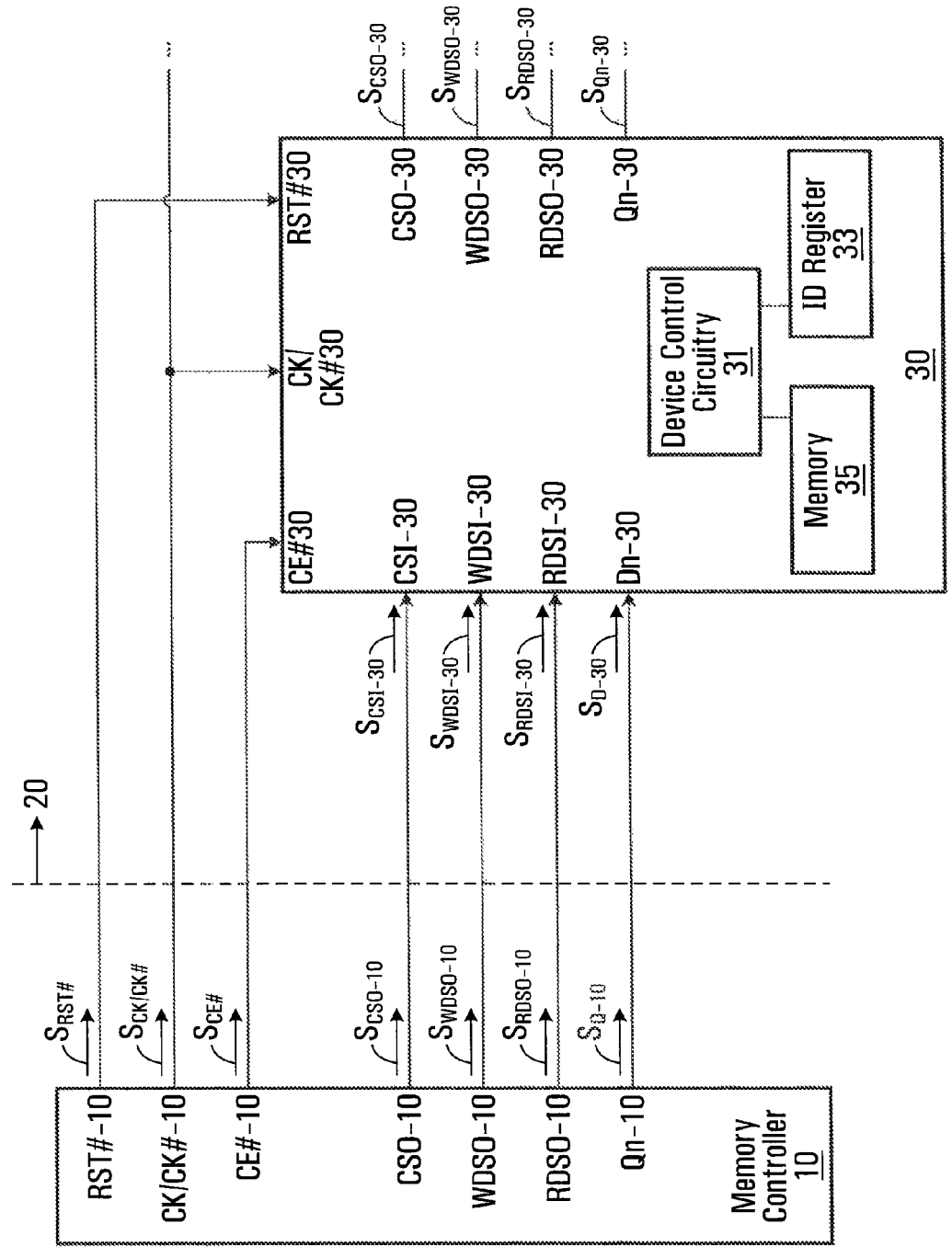
FIG. 1B shows in greater detail an example of the interconnection between the memory controller and a first one of the memory devices in the chain.

With additional reference to FIG. 1B, the first memory device 30 further includes three control input ports, namely command strobe input port CSI-30, write data strobe input port WDSI-30 and read data strobe input port RDSI-30. These control input ports carry respective control signals from the memory controller 10. Specifically, command strobe input port CSI-30 carries a command/address control signal $S_{CSI}$-30, which emanates from command strobe output port CSO-10 of the memory controller 10 in the form of a command/address control signal $S_{CSO}$-10. Similarly, write data strobe input port WDSI-30 carries a write data control signal $S_{WDSI}$-30, which emanates from write data strobe output port WDSO-10 of the memory controller 10 in the form of a write data control signal $S_{WDSO}$-10. Finally, read data strobe input port RDSI-30 carries a read data control signal $S_{RDSI}$-30, which emanates from read data strobe output port RDSO-10 of the memory controller 10 in the form of a read data control signal $S_{RDSO}$-10.

The first memory device 30 is also provided with command strobe output port CSO-30, write data strobe output port WDSO-30 and read data strobe output port RDSO-30, which are respectively connected to command strobe input port CSI-40, write data strobe input port WDSI-40 and read data strobe input port RDSI-40 of the next memory device in the chain 20, namely first intermediate memory device 40.

The first memory device 30 includes device control circuitry 31 for performing device operations, an ID register 33 for storing an assigned device identifier (ID) (or "device address") and a memory 35 for storing data. The device control circuitry 31 performs data writes to and data reads from the memory 35 and others.

Turning now to the other memory devices in the chain 20, the first intermediate memory device 40, the second intermediate memory device 50 and the last memory device 60 each include an analogous set of input and output ports, with analogous interconnections between adjacent memory devices. In the case of the last memory device 60, command strobe output port CSO-60 is connected to the memory controller 10's command strobe input port CSI-10, write data strobe output port WDSO-60 is connected to the memory controller 10's write data strobe input port WDSI-10, read data strobe output port RDSO-60 is connected to the memory controller 10's read data strobe input port RDSI-10 and serial data output port Qn-60 is connected to the memory controller 10's serial data input port Dn-10.

In addition to the signals carried on a given link between adjacent devices of the chain 20, the memory system also provides a set of signals that are carried directly from the memory controller 10 to each of the memory devices 30, 40, 50, 60. For example, the first memory device 30 includes clock input port CK/CK#-30 carrying a pair of differential clock signals $S_{CK}/S_{CK\#}$, (e.g., free-running clock signals), as well as, optionally, chip enable port CE#-30 carrying a chip enable signal $S_{CE\#}$ and reset port RST#-30 carrying a reset signal $S_{RST\#}$. In a specific non-limiting embodiment, the clock signals $S_{CK}/S_{CK\#}$ may emanate from a clock output port CK/CK#-10 of the memory controller 10 and may be implemented in a multi-drop bus architecture such that they are commonly fed to the memory devices 30, 40, 50, 60. In other embodiments, the clock signals $S_{CK}/S_{CK\#}$ can be propagated around the ring/chain. In still other embodiments, a single-ended clock signal may be provided. For their part, the chip enable signal $S_{CE\#}$ and the chip reset signal $S_{RST\#}$ may similarly be commonly fed to the memory devices 30, 40, 50, 60 from, respectively, the memory controller 10's chip enable port CE#-10 and chip reset port RST#-10. Of course, a dedicated configuration is also possible, but would require a greater number of signal lines and memory controller ports.

In operation, the memory controller 10 causes data to be written to and read from individual memory devices in the chain 20 through the use of a packet-based communication protocol. To participate in the packet-based communication protocol, each of the memory devices 30, 40, 50, 60 is assigned a respective device identifier (ID) (or "device address"), which is used for participating in the protocol. The identifiers (or "device addresses") of the memory devices 30, 40, 50, 60 can be assigned by the memory controller 10 during an initialization phase. For example, the memory controller 10 sends the device identifier of memory device 30 and, in response, memory device 30 stores the device identifier in the ID register 33. Alternatively, the identifiers of the memory devices 30, 40, 50, 60 can be hardcoded in the memory devices themselves and discovered by the memory controller 10 during a discovery phase. For the purposes of normal operation, the memory devices 30, 40, 50, 60 are enabled and not reset. That is to say, the reset signal is not asserted (i.e., $S_{RST\#}$ is high) and the chip enable signal is asserted (i.e., $S_{CE\#}$ is low). The reset signal $S_{RST\#}$ is asserted during power-up sequence of system to initialize all connected memory devices.

Operation of Memory Controller

Figure 2:
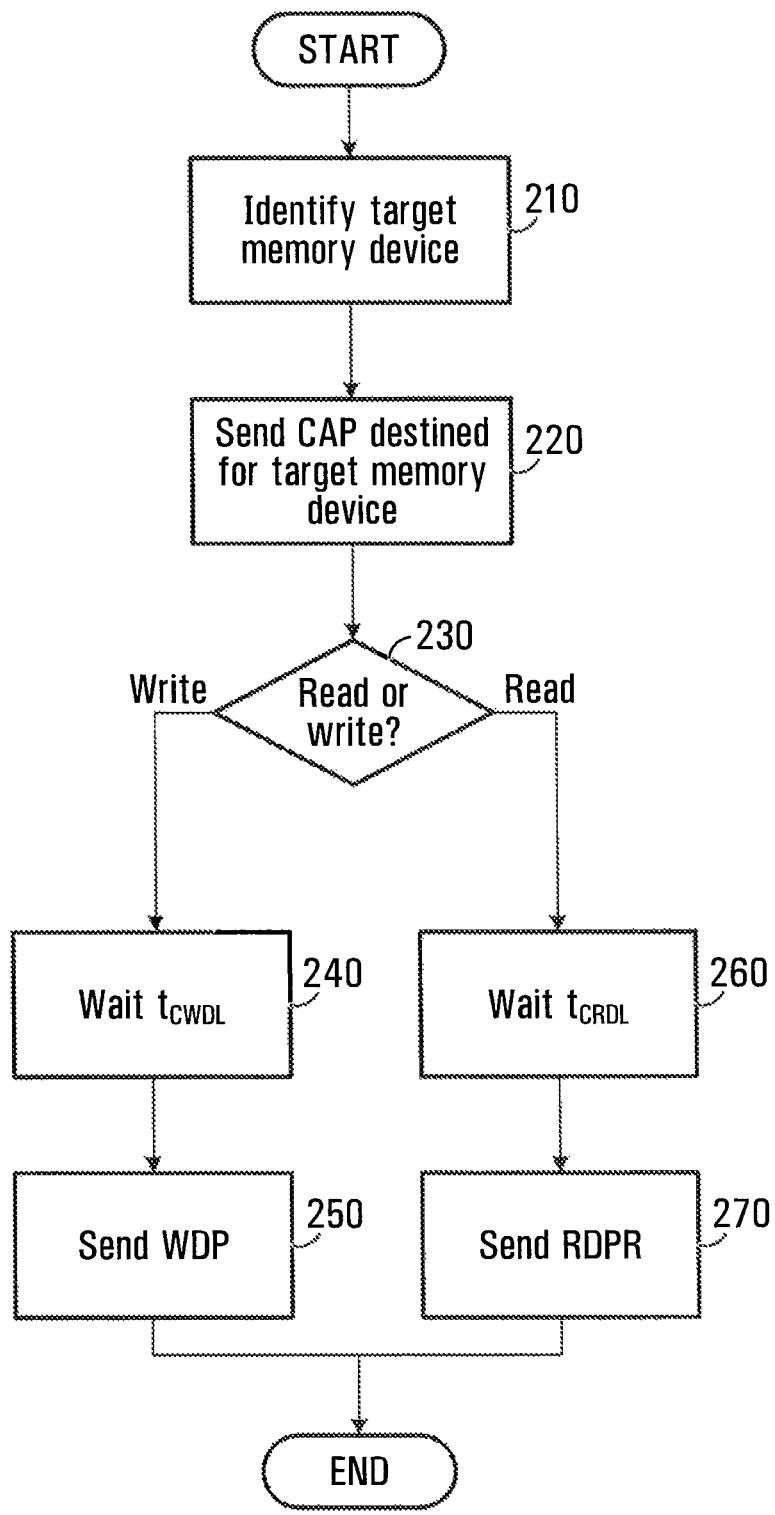
FIG. 2 is a flowchart illustrating operation of the memory controller, in accordance with a specific non-limiting embodiment of the present invention.

FIG. 2 illustrates steps that can be performed by the memory controller 10 in accordance with the packet-based communication protocol. Specifically, at step 210, the memory controller 10 identifies a "target memory device" that it wishes to either write data to, or read data from. The target memory device could be any of the memory devices 30, 40, 50, 60.

Figure 4:
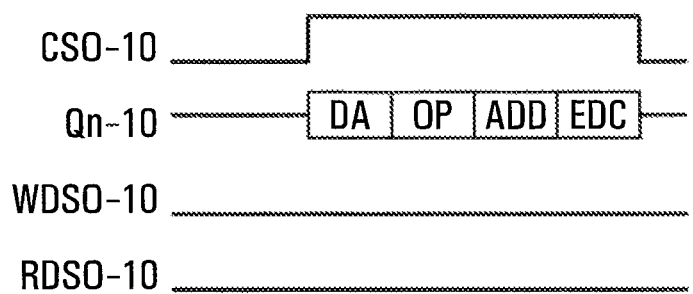
FIG. 4 shows a timing diagram of a command/address packet (CAP), from the perspective of the memory controller.

At step 220, the memory controller 10 issues a command/address packet (CAP) destined for the target memory device. The CAP is specially formulated to convey the identifier of the target memory device and the desired operation to be performed (e.g., read or write) as well as a memory address (e.g., a starting address) involved in the operation and possibly also a duration (in terms of a number of bytes). As shown in FIG. 4, The CAP is created by controlling the command/address control signal on command strobe output port CSO-10, while placing data relevant to the CAP (such as an operation code or an address) on serial data output Qn-10. In FIG. 4, "DA", "OP", "ADD" and "EDC" refer to the device address (or identifier) of the target device, the operation code (which identifies the specific operation to be performed), the column and/or row address in the memory cell array of the memory device, and the error detection code, respectively. Returning to FIG. 2, once it has issued a CAP destined for the target memory device, the memory controller 10 either issues a write data packet (WDP) or a read data packet request (RDPR), depending on whether the operation to be performed is a write or a read, respectively (see step 230).

Specifically, in the case of a write operation, the memory controller 10 waits for a duration of $t_{CWDL}$ (step 240) after sending the CAP before sending a WDP (step 250). This delay allows the target memory device to recognize the CAP and set itself up for processing the ensuing WDP. In order to send the WDP, the memory controller 10 asserts the write data control signal $S_{WDSO}$-10 on write data strobe output port WDSO-10 and outputs a data signal $S_Q$-10 onto serial data output port Qn-10. The data conveyed by the data signal $S_Q$-10 is written to the target memory device, beginning at the address specified in the previously issued CAP. The WDP is delimited by the time during which the write data control signal $S_{WDSO}$-10 on write data strobe output port WDSO-10 is asserted. In other words, the WDP can be composed of a plurality of portions spaced apart in time, such potions corresponding to time periods during which the write data control signal $S_{WDSO}$-10 on write data strobe output port WDSO-10 was asserted.

Alternatively, in the case of a read operation, the memory controller 10 waits for a duration of $t_{CRDL}$ (step 260) after sending the CAP before sending a RDPR (step 270). This delay allows the target memory device to recognize the CAP and set itself up for processing the ensuing RDPR. In order to send the RDPR, the memory controller 10 asserts the read data control signal $S_{RDSO}$-10 on read data strobe output port RDSO-10. The RDPR is delimited by the time during which the read data control signal $S_{RDSO}$-10 on read data strobe output port RDSO-10 is asserted. In other words, the RDPR can be composed of a plurality of portions spaced apart in time, such potions corresponding to time periods during which the read data control signal $S_{RDSO}$-10 on the read data strobe output port RDSO-10 was asserted.

Operation of Memory Device

Figure 3A:
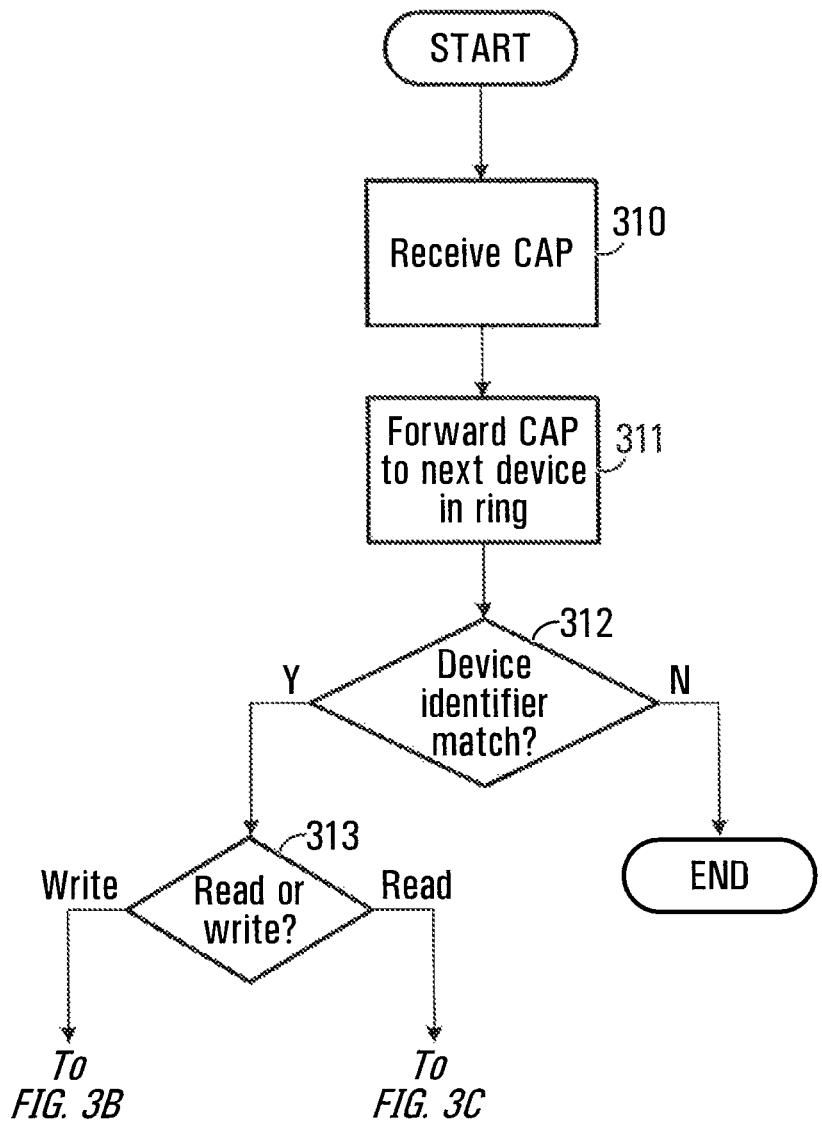
FIGS. 3A-3C are, collectively, a flowchart illustrating operation of a memory device, in accordance with a specific non-limiting embodiment of the present invention.
Figure 3B:
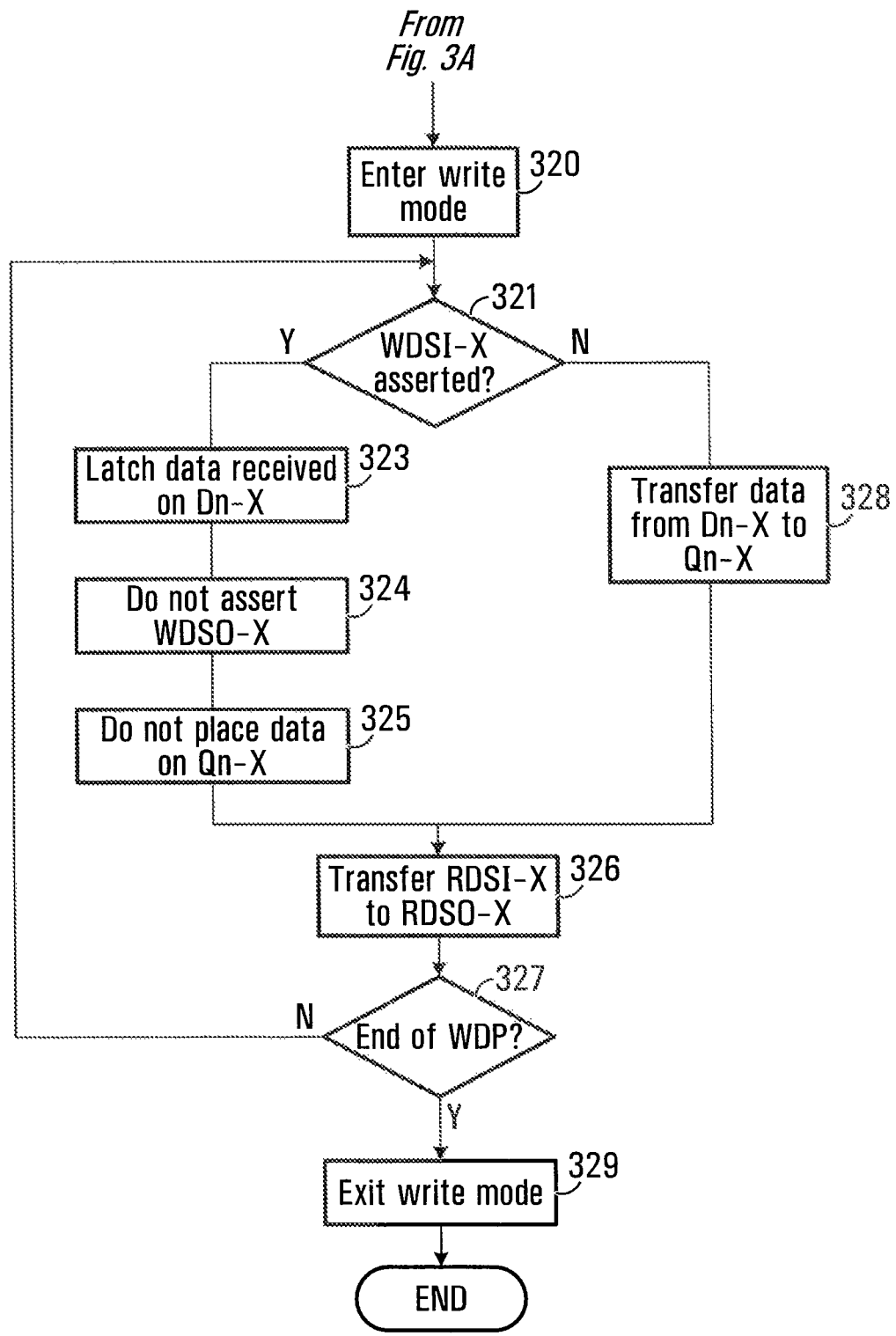
Figure 3C:
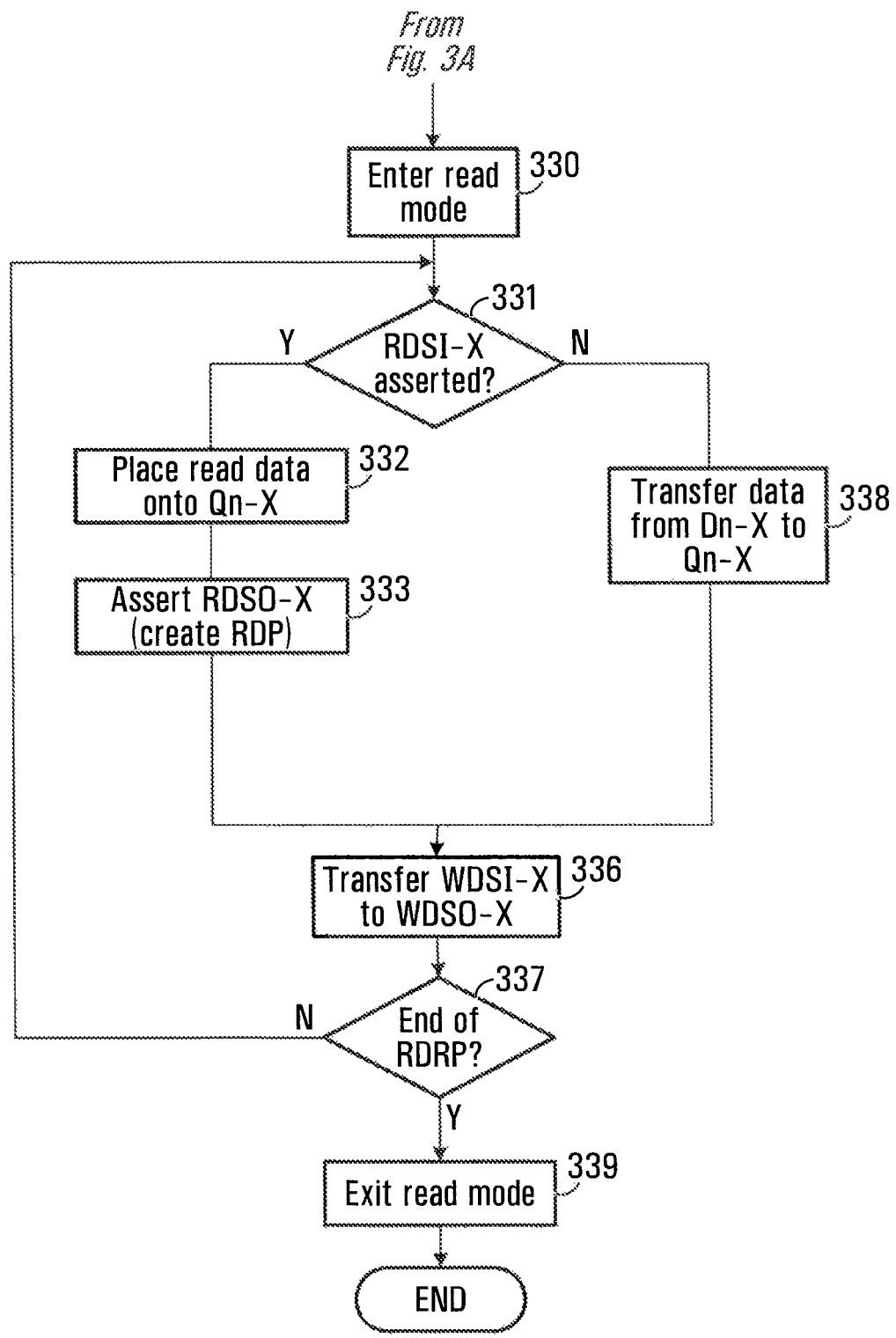

FIGS. 3A to 3C illustrate steps that can be performed by any particular one of the memory devices 30, 40 50, 60, including the target memory device, in accordance with the packet-based communication protocol. At step 310, the particular memory device (which may or may not be the target device) receives the CAP, whereas at step 311, the particular memory device forwards the CAP to the "next device". Depending on the position of the particular memory device within the chain 20, such next device is either another memory device in the chain 20 or the memory controller 10.

Figure 5:
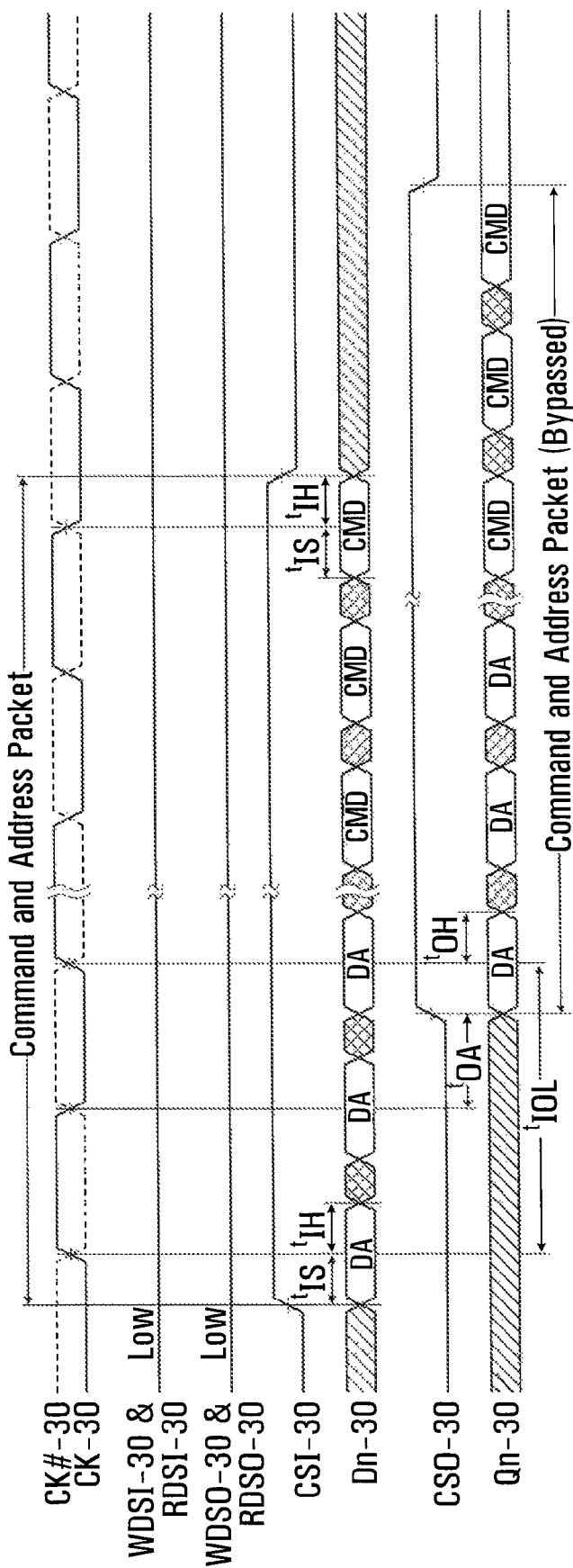
FIG. 5 shows a timing diagram of a command/address packet (CAP), from the perspective of a memory device.

With additional reference to FIG. 5, there is shown an example timing diagram which illustrates receipt and forwarding of the CAP when the particular memory device is the memory device 30. It will be seen that command strobe input port CSI-30 is asserted over a certain period of time, and during this period of time, serial data input port Dn-30 carries a data signal. As has been mentioned above, this data signal is formulated to contain an identifier of the target memory device, an operation to be performed, a memory location and/or other information pertaining to the CAP. The information in the data signal is determined (e.g., decoded) by the particular memory device. In addition, the CAP is forwarded to the next device after an input-output latency of $t_{IOL}$, which is in this case 1 clock cycle. In this specific example, the data signal on serial data input port Dn-30 is transferred to serial data output port Qn-30, and the signal on command strobe input port CSI-30, which delimits the CAP, is transferred to command strobe output port CSO-30.

Returning now to FIG. 3A, it is assumed that the particular memory device has determined the information contained in the CAP. At step 312, the particular memory device compares the identifier in the CAP to its own assigned identifier. Step 312 can be performed before, after or during step 311, depending on the desired implementation. If the particular memory device does not recognize the identifier in the CAP as being its own identifier, the particular memory device concludes that it is not the target memory device and does not take further action with respect to the CAP. In addition, if it is determined that it is not the target memory device, the particular memory device will not be attentive to any subsequent WDP or a RDPR or issued by the memory controller 10. As such, the particular memory device simply propagates the received control signals towards the next device. Specifically, this includes transferring any received read data control signal from its read data strobe input port to its read data strobe output port, transferring any received write data control signal from its write data strobe input port to its write data strobe output port, as well as transferring any received data signal from its serial data input port to its serial data output port.

Returning to step 312, consider now the case where the particular memory device does recognize the identifier in the CAP as being its own identifier. This means that the particular memory device is in fact the target memory device. For simplicity of notation, the target memory device is denoted "X", where $X \in \{30, 40, 50, 60\}$. Accordingly, at step 313, the target memory device X determines the nature of the command to be performed (e.g., read or write), stores any address information (e.g., the starting address for a read or write) and becomes attentive to further signaling from the memory controller 10.

In the case of a write command, and with reference to FIG. 3B, the target memory device X enters a "write mode" at step 320, during which the target memory device X is attentive to assertion of the write data control signal $S_{WDSI}$-X on write data strobe input port WDSI-X, which delimits the incoming WDP. If the write data control signal $S_{WDSI}$-X on write data strobe input port WDSI-X is de-asserted (see the "NO" branch of step 321), this indicates suspension of the write command, and if it is re-asserted, this indicates resumption of the write command. During the time when the write command is suspended (i.e., the "NO" branch of step 321), the data signal received on serial data input port Dn-X is transferred to serial data output port Qn-X (step 328).

On the other hand, during the time when the write operation is in progress (i.e., the "YES" branch of step 321), the target memory device X proceeds to capture (e.g., latch) the data signal $S_D$-X received on serial data input port Dn-X to a page buffer (step 323). The page buffer is written to the internal memory of the target memory device X, as will be described in further detail herein below. This operation is performed in synchronism with the clock signals $S_{CK/CK\#}$ while the write data control signal $S_{WDSI}$-X on write data strobe input port WDSI-X remains asserted, thereby allowing data to be serially written to the target memory device X. (Data transfers can be referenced to the transition edges of the clock signals $S_{CK/CK\#}$, thereby occurring twice per clock period.) Also, because the target memory device X is the intended recipient of the data, there is no need to propagate the received data further along the chain 20. Thus, the target memory device X does not assert the write data control signal $S_{WDSO}$-X on write data strobe output port WDSO-X (step 324). Also, the target memory device X does not transfer the data signal $S_D$-X from serial data input port Dn-X to serial data output port Qn-X (step 325).

In addition, while the target memory device X is in write mode, and regardless of whether the write operation is ongoing or suspended, the target memory device X is unresponsive to assertion of the read data control signal $S_{RDSI}$-X on read data strobe input port RDSI-X. Therefore, the target memory device X simply transfers the read data control signal $S_{RDSI}$-X from read data strobe input port RDSI-X to read data strobe output port RDSO-X (step 326). This is done so as to not to interfere with a read operation that the memory controller 10 may be in the process of conducting with another memory device elsewhere in the chain 20.

The aforementioned steps (321-326) continue to be executed until the WDP is finished, as conceptually illustrated by step 327. The length of the WDP (in terms of the number of bytes or words) can be specified in the previously received CAP or determined by the duration of the write data control signal $S_{WDSO}$-10 from the controller 10. Once the WDP is finished, the target memory device X exits write mode at step 329.

Figure 6:
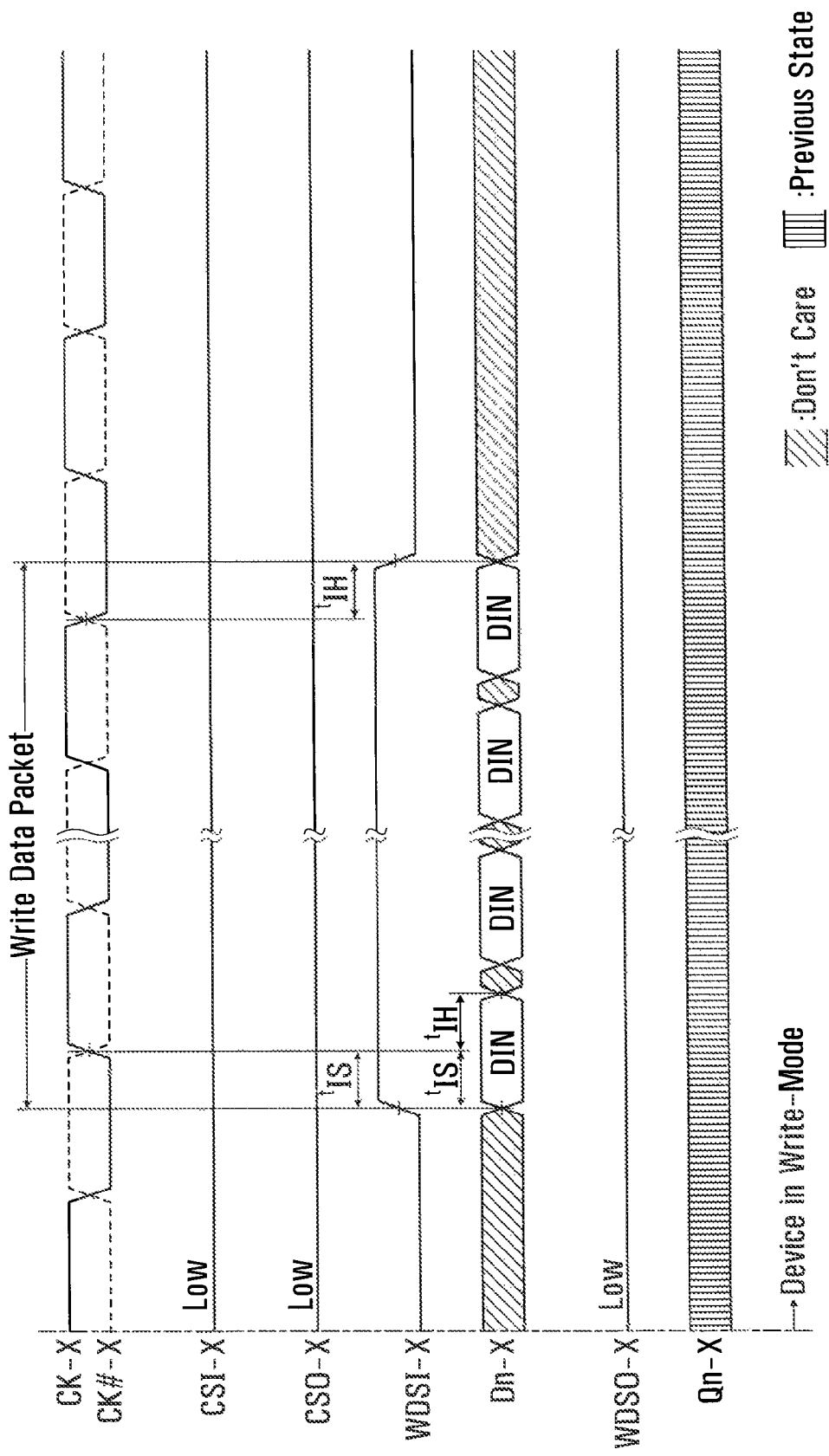
FIG. 6 shows a timing diagram of a write data packet (WDP), from the perspective of a memory device.

With additional reference to FIG. 6, there is shown an example timing diagram which illustrates responsiveness to the WDP by the target memory device X. It will be seen that write data strobe input port WDSI-X is asserted over a certain period of time, and during this period of time, serial data input port Dn-X carries a data signal. The information in the data signal is written to the internal memory of the target memory device X. In addition, if memory device X were not the target memory device, then the write data control signal and the read data control signal would be forwarded to the next device after an input-output latency of $t_{IOL}$, which is in this case 1 clock cycle. However, FIG. 6 shows the situation where memory device X is the target memory device (and is in write mode), and therefore the signal on write data strobe input port WDSI-X, which delimits the WDP, is not transferred to write data strobe output port WDSO-X.

In the case of a read command, and with reference to FIG. 3C, the target memory device X enters a "read mode" at step 330, during which the target memory device X is attentive to assertion of the read data control signal $S_{RDSI}$-X on read data strobe input port RDSI-X, which delimits the incoming RDPR. If the read data control signal $S_{RDSI}$-X on read data strobe input port RDSI-X is de-asserted (see the "NO" branch of step 331), this indicates suspension of the read command, and if it is re-asserted, this indicates resumption of the read command. During the time when the read command is suspended (i.e., the "NO" branch of step 331), the data signal received on serial data input port Dn-X is transferred to serial data output port Qn-X (step 338).

On the other hand, during the time when the read operation is in progress (i.e., the "YES" branch of step 331), the target memory device X proceeds to place the data to be read from internal memory onto serial data output port Qn-X (step 332). The data can be pre-fetched into the page buffer in preparation for receipt of the RDPR. This operation is performed in synchronism with the clock signals $S_{CK/CK\#}$ while the read data control signal $S_{RDSI}$-X on read data strobe input port RDSI-X remains asserted, thereby allowing data to be serially read from the target memory device X. (Data transfers can be referenced to the transition edges of the clock signals $S_{CK/CK\#}$, thereby occurring twice per clock period.) Also, the target memory device X asserts the read data control signal $S_{RDSO}$-X on read data strobe output port RDSO-X (step 333). In this way, the target memory device X effectively creates a read data packet (RDP), which is delimited by the time during which the read data control signal $S_{RDSO}$-X on read data strobe output port RDSO-X is asserted. In other words, the RDP can be composed of a plurality of portions spaced apart in time, such potions corresponding to time periods during which the read data control signal $S_{RDSO}$-X on read data strobe output port RDSO-X was asserted.

In addition, while the target memory device X is in read mode, and regardless of whether the read operation is ongoing or suspended, the target memory device X is unresponsive to assertion of the write data control signal $S_{WDSI}$-X on write data strobe input port WDSI-X. Therefore, the target memory device X does transfer the write data control signal $S_{WDSI}$-X from write data strobe input port WDSI-X to write data strobe output port WDSO-X (step 336). This is done so as to not to interfere with a write operation that the memory controller 10 may be in the process of conducting with another memory device elsewhere in the chain 20.

The aforementioned steps (331-333) continue to be executed until the RDPR is finished, as conceptually illustrated by step 337. The length of the RDPR (in terms of the number of bytes or words) can be specified in the previously received CAP or determined by the duration of the read data control signal $S_{RDSO}$-10 from the controller 10. Once the RDPR is finished, the target memory device X exits read mode at step 339.

Figure 7:
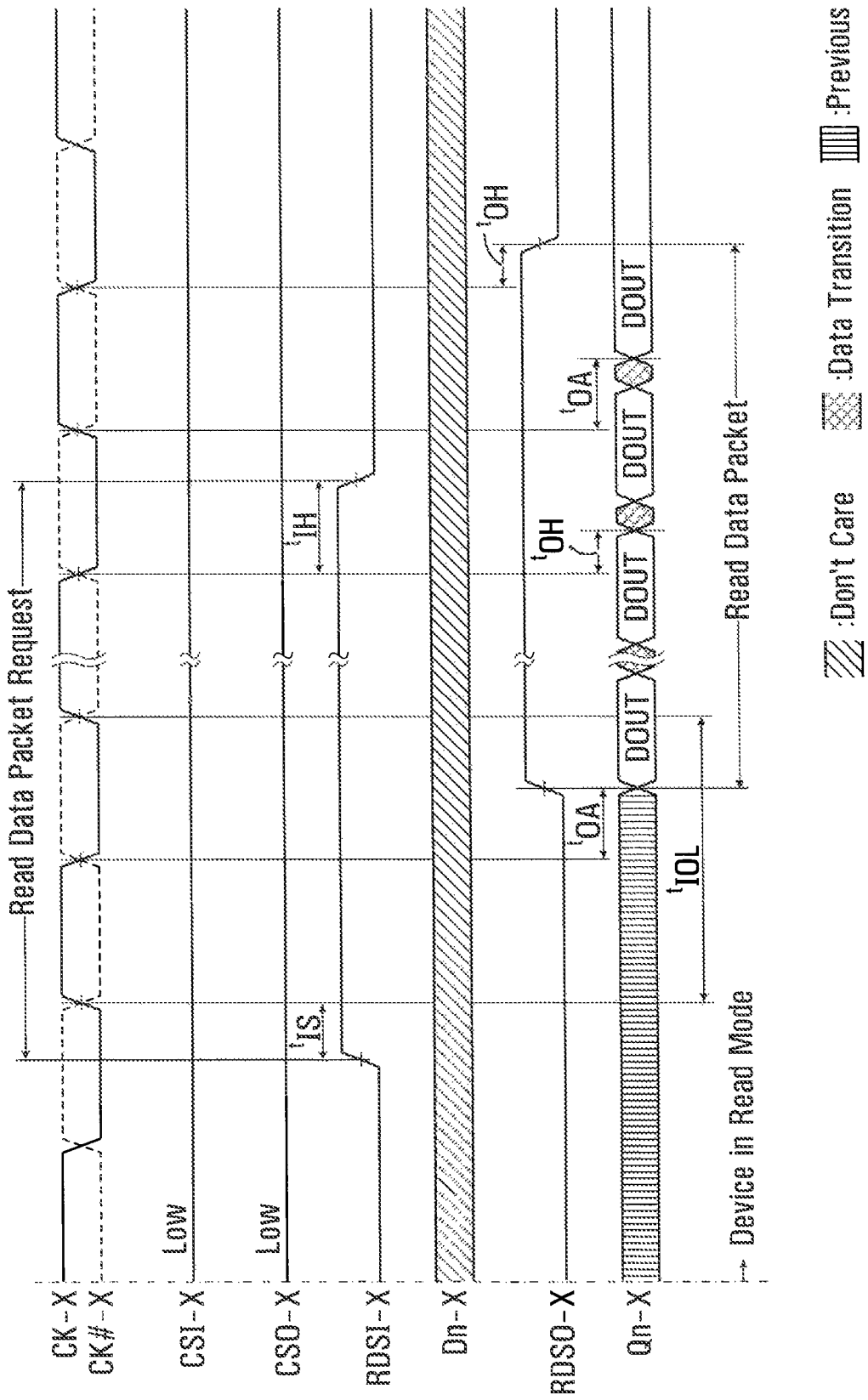
FIG. 7 shows a timing diagram of a read data packet request (RDPR) and a read data packet (RDP), from the perspective of a memory device.

With additional reference to FIG. 7, there is shown an example timing diagram which illustrates responsiveness to the RDPR by the target memory device X. It will be seen that read data strobe input port RDSI-X is asserted over a certain period of time. Information is read from the internal memory of the target memory device X and output onto serial data output port Qn-X after an input-output latency of $t_{IOL}$, which is in this case 1 clock cycle. Also, the write data control signal and the read data control signal are forwarded to the next device after the input-output latency of $t_{IOL}$. Specifically, FIG. 7 shows the signal on read data strobe input port RDSI-X, which delimits the RDP, being transferred to read data strobe output port RDSO-X.

A summary of the behaviour of the various ports of the particular memory device is provided in Table 1.

| Pin Name | Type | Description |
| --- | --- | --- |
| CK/CK# | Input | Clock: CK is the system clock input. CK and CK# are differential clock inputs. Commands, addresses, input data and output data can be referenced to the crossing edges of CK and CK# in both directions. |

-continued

| Pin Name | Type | Description |
| --- | --- | --- |
| CE# | Input | Chip Enable: When CE# is LOW, the device is enabled. Once the device starts a Program or Erase operation, the Chip Enable pin can be de-asserted. In addition, CE# LOW activates and CE# HIGH deactivates the internal clock signals. |
| RST# | Input | Chip Reset: RST# provides a reset for the device. When RST# is HIGH, the device is in a normal operating mode. When RST# is LOW, the device will enter the Reset mode. |
| Dn | Input | Data Input: Dn (n = 0, 1, 2, 3, 4, 5, 6, or 7) receives commands, addresses, and data. If the device is configured in '1-bit Link mode (=default)', D0 is the only valid signal and receives one byte of packet in 8 crossings of CK/CK#. If the device is configured in '2-bit Link mode', D0 & D1 are only valid signals and receive one byte of packet in 4 crossings of CK/CK#. If the device is configured in '4-bit Link mode', D0, D1, D2 & D3 are all valid signals and receive one byte of packet in 2 crossings of CK/CK#. If the device is configured in '8-bit Link mode', D0, D1, D2, D3, D4, D5, D6, & D7 are all valid signals and receive one byte of packet in 1 crossings of CK/CK#. Unused data input pins can be grounded. |
| Qn | Output | Data Output: Qn (n = 0, 1, 2, 3, 4, 5, 6, or 7) transmits output data during read operation or simply bypasses the signals on Dn pin(s) with input-to-output latency (=tIOL). If device is configured in '1-bit Link mode (=default)', Q0 is the only valid signal and transmits one byte of packet in 8 crossings of CK/CK#. If the device is configured in '2-bit Link mode', Q0 & Q1 are the only valid signals and transmit one byte of packet in 4 crossings of CK/CK#. If the device is configured in '4-bit Link mode', Q0, Q1, Q2 & Q3 are all valid signals and transmit one byte of packet in 2 crossings of CK/CK#. If the device is configured in '8-bit Link mode', Q0, Q1, Q2, Q3, Q4, Q5, Q6 & Q7 are all valid signals and transmit one byte of packet in 1 crossings of CK/CK#. Unused output pins can be DNC (=Do Not Connect). |
| CSI | Input | Command Strobe Input: When CSI is HIGH, command and address inputs through Dn are latched on the crossing of CK and CK#. |
| CSO | Output | Command Strobe Output: Echo signal of CSI. It transfers CSI transitions with tIOL in synchronous manner. |
| WDSI | Input | Write Data Strobe Input: When WDSI is HIGH while in write mode, it enables the write data path without data bypassing (kind of data truncation). When WDSI is HIGH while in read mode, it bypasses Dn values and enables Qn. |
| WDSO | Output | Write Data Strobe Output: Echo signal of WDSI. It transfers WDSI transitions with tIOL in synchronous manner when chip is not in 'write mode'. |
| RDSI | Input | Read Data Strobe Input: When RDSI is HIGH while in read mode, it enables the read data path and Qn buffer. When RDSI is LOW while in read mode, the Qn buffer holds the previous data accessed. When RDSI is HIGH while in write mode, it is bypassed through RDSO. |
| RDSO | Output | Read Data Strobe Output: Echo signal of RDSI. It transfers RDSI transitions with tIOL in synchronous manner for all serially-connected memories. |

It will be appreciated the fact that the read data control signal is separate from the write data control signal provides an independence with which different memory devices can be read from or written to, and can lead to faster and/or more efficient performance. Two non-limiting use cases will be provided for illustrative purposes.

Example 1

RDSI Offset Relative to WDSI

Consider a first example scenario, in which the first intermediate memory device 40 is to be written to and in which the last memory device 60 is to be read from. Assume that the memory controller 10 issues a first CAP destined for the first intermediate memory device 40, in response to which the first intermediate memory device 40 enters write mode. Similarly, assume that the memory controller 10 issues a second CAP destined for the last memory device 60, in response to which the last memory device 60 enters read mode. Now, assume that the memory controller 10 wishes to start reading data from the last memory device 60 but that, for some reason, the data to be written to the first intermediate device 40 is not yet available to the memory controller 10. In this situation, the memory controller 10 can issue a read data packet request (RDPR) to the last memory device 60 by asserting the read data control signal $S_{RDSO}$-10 on read data strobe output port RDSO-10, thereby initiating the RDPR. However, because the write data is unavailable, the write data control signal $S_{WDSO}$-10 on write data strobe output port WDSO-10 remains de-asserted.

Assume now that, several clock cycles later, the data to be written to the first intermediate memory device 40 becomes available to the memory controller 10. At that point, the previously issued RDPR is already en route towards the last memory device 60. Nevertheless, the memory controller 10 places data onto serial data output port Qn-10 and asserts the write data control signal $S_{WDSO}$-10 on write data strobe output port WDSO-10, thereby initiating a write data packet (WDP). Meanwhile, it will be recalled that the read data control signal $S_{RDSO}$-10 was previously asserted on read data strobe output port RDSO-10. Thus, the WDP and the RDPR are offset relative to one another, but still allow the write operation (by the first intermediate memory device 40) and the read operation (by the last memory device 60) to be executed properly. This advantageous functionality is made possible by mutual independence of the read data control signal $S_{RDSO}$-10 and the write data control signal $S_{WDSO}$-10.

Example 2

Suspension and Resumption

Consider a second example scenario, in which the first memory device 30 is being read from for a significant duration (e.g., retrieval of a digital photo for viewing). This means that the memory controller 10 is in the process of issuing a RDPR by continually asserting the read data control signal $S_{RDSO}$-10 at read data strobe output port RDSO-10 of the memory controller 10. At the first memory device 30, the asserted read data control signal $S_{RDSI}$-30, which arrives at read data strobe input port RDSI-30, is transferred to read data strobe output port RDSO-30, while the first memory device 30 outputs a data signal $S_Q$-30 synchronously onto serial data output port Qn-30. Now, during this time when reading from the first memory device 30 is in progress, let it be assumed that the memory controller 10 desires to write a small amount of data to the second intermediate memory device 50 (e.g., for updating control information). In accordance with embodiments of the present invention, this can be achieved without having to wait for the read operation to be complete.

Specifically, the memory controller 10 issues a CAP destined for the second intermediate memory device 50, in response to which the second intermediate memory device 50 enters write mode. At this point, it will be appreciated that placing data onto serial data output port Qn-10 would not be desirable, because upon arrival at the first memory device 30, such data would create confusion with the data being placed onto serial data output port Qn-30. Therefore, the memory controller 10 takes the step of suspending the RDPR that it was in the process of issuing. In particular, the memory controller 10 de-asserts the read data control signal $S_{RDSO}$-10 at read data strobe output port RDSO-10 of the memory controller 10. At the first memory device 30, the de-asserted read data control signal $S_{RDSI}$-30 arrives at read data strobe input port RDSI-30. In response, the first memory device 30 transfers the received read data control signal $S_{RDSI}$-30 over to read data strobe output port RDSO-30, and also halts outputting of the data signal $S_Q$-30 onto serial data output port Qn-30. Thus, although the first memory device 30 remains in read mode, the read operation is suspended.

After having de-asserted the read data control signal $S_{RDSO}$-10 at its read data strobe output port RDSO-10, the memory controller 10 places a data signal $S_Q$-10 onto serial data output port Qn-10 and asserts the write data control signal $S_{WDSO}$-10 on write data strobe output port WDSO-10, thereby initiating a write data packet (WDP). The WDP is propagated through the first memory device 30 and the first intermediate memory device 40, until it reaches the second intermediate memory device 50. In response, the second intermediate memory device 50 captures the data signal $S_D$-50 on its serial data input port Dn-50. The data captured in this way is written to internal memory of the second intermediate memory device 50. This operation is performed in synchronism with the clock signals $S_{CK/CK\#}$ while the write data control signal $S_{WDSI}$-50 on write data strobe input port WDSI-50 remains asserted, thereby allowing data to be serially written to the second intermediate memory device 50.

Once the write operation is complete, the memory controller 10 can resume the (previously suspended) read operation involving the first memory device 30. Specifically, the memory controller 10 re-asserts the read data control signal $S_{RDSO}$-10 at read data strobe output port RDSO-10 of the memory controller 10. At the first memory device 30, the re-asserted read data control signal $S_{RDSI}$-30 arrives at read data strobe input port RDSI-30. The first memory device 30, which has remained in read mode even during the suspended read operation, recognizes re-assertion of the read data control signal $S_{RDSI}$-30 and resumes outputting the data signal $S_Q$-30 synchronously onto the serial data output port Qn-30. Meanwhile, the read data control signal $S_{RDSI}$-30 is transferred from read data strobe input port RDSI-30 to read data strobe output port RDSO-30.

Thus, it is possible to interrupt a read operation with one memory device of the chain 20 in order to execute a write operation with a different memory device of the chain 20. This feature may lead to more efficient usage of memory and potentially a superior user experience. In a similar manner, the memory controller 10 can suspend and resume a write operation through control of the write data control signal $S_{WDSO}$-10. In the case of suspending or resuming a write operation, it may be desirable for the memory controller 10 to coordinate control of the data signal $S_Q$-10 on serial data output port Qn-10 with de-assertion of the write data control signal $S_{WDSO-10}$ on write data strobe output port WDSO-10.

Therefore, using the presently proposed technique, write and read data lengths can be made different according to separate write and read requirements. Also, it has been shown how it may be useful to provide time interleaving of the RDPR destined for one memory device and the WDP destined for another memory device. That is to say, at least a portion of the RDPR falls between two portions of the WDP, or at least a portion of the WDP falls between two portions of the RDPR. The RDPR and the WDP may also be time interleaved with respect to one another in the case where that each of the RDPR and the WDP consists of multiple portions that are time interleaved.

From the above description, it will be appreciated that the elements of the memory system utilize a dedicated write data control signal for controlling write data packets (WDPs) and a dedicated read data control signal for controlling read data packet requests (RDPRs) and read data packets (RDPs). By this functional regulation, simultaneous write and read (i.e., duplex) operations can be achieved without any data strobe length restrictions between a write operation and a read operation, as independent write and read data length control is provided by the write data control signal and the read data control signal, respectively. Therefore, the memory controller 10 can have more flexibility to control communication between the memory devices 30, 40, 50, 60 and the memory controller 10 itself.

Figure 8:
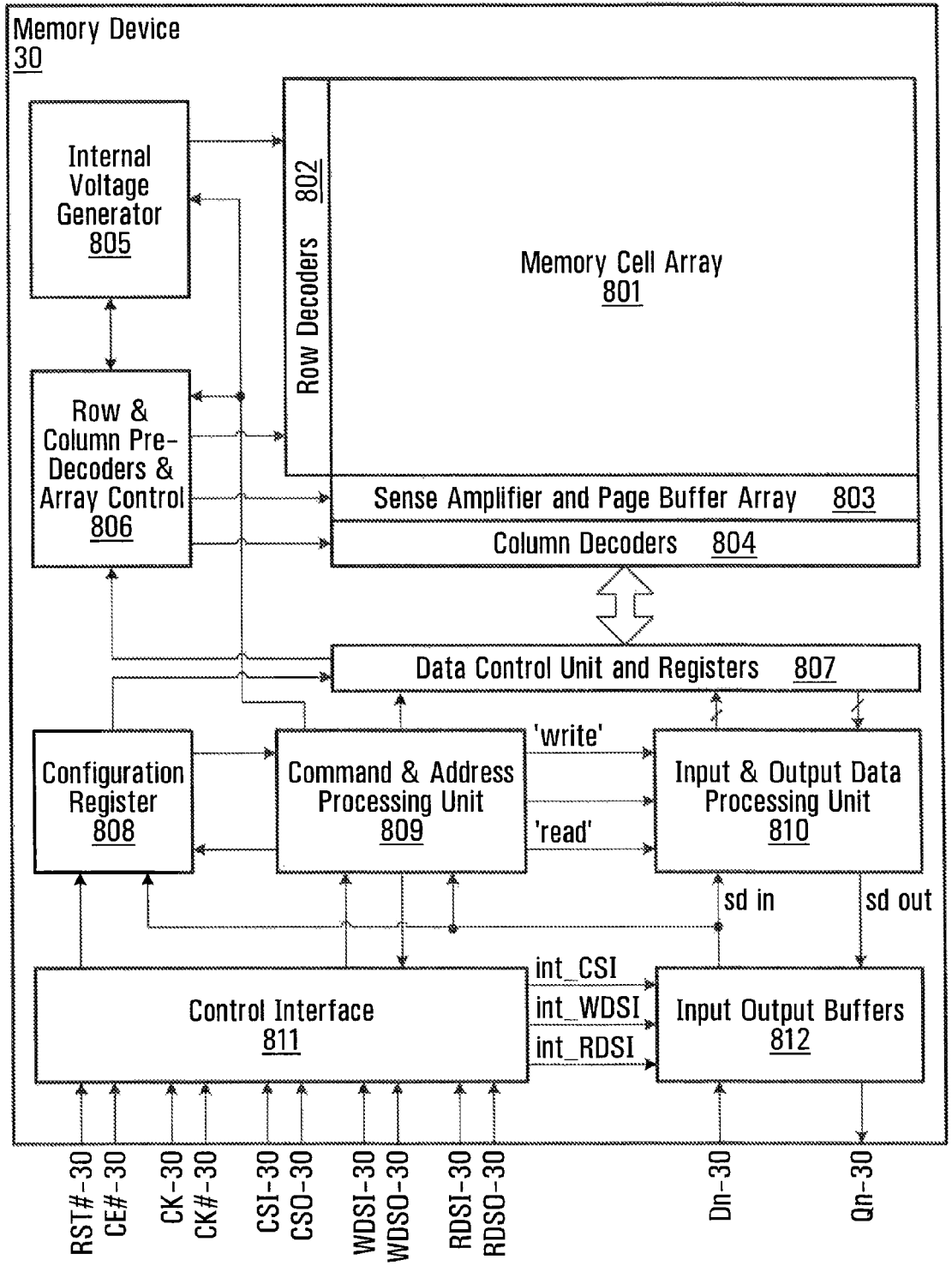
FIG. 8 is a block diagram of a memory device, in accordance with a specific non-limiting embodiment of the present invention.

In order to achieve the above-described functionality, the memory devices can be implemented as shown in FIG. 8, which illustrates a functional block diagram of a representative memory device, in this case chosen to be the first memory device 30, although the other memory devices 40, 50, 60 can be identical. Referring to FIG. 8, therefore, the memory device 30 includes an internal memory, such as a memory cell array 801, which may be a single bank of memory cell arrays or it could be multiple banks of memory cell arrays, depending on design variations. In addition to the input/output interface and the internal memory is control circuitry. Specifically, Row decoders 802 perform final decoding processes for the given and pre-decoded row addresses. Column decoders 804 perform final decoding processes for the given and pre-decoded column addresses. A sense amplifier and page buffer array 803 performs sensing and amplifying operations for each of the bit lines of the memory cell array 801, temporarily stores sensed data in page buffers, and also captures and temporarily stores input data. An internal voltage generator 805 generates the required voltage levels used by other circuit blocks in the memory device 30. Row and column pre-decoders and array control circuitry 806 pre-decodes the given row address information and column address information from a command and address processing unit 809, and also generates the requisite control signals for the row decoders 802, sense amplifier and page buffer array 803 and column decoders 804. Data control unit and registers 807 process and store all necessary data transferring information. A configuration register 808 stores various configurable, programmable and readable and writable register information.

A control interface 811 receives and/or transmits various control input signals such as $S_{CSI}$-30, $S_{CSO}$-30, $S_{WDSI}$-30, $S_{WDSO}$-30, $S_{RDSI}$-30, $S_{RDSO}$-30, $S_{RST\#}$, $S_{CE\#}$ and $S_{CK/CK\#}$. It also generates internal control signals, int_CSI, int_WDSI, and int_RDSI in order to control input and output buffers 812. In FIG. 8, internal clock distribution and signaling is not shown for the purpose of simplifying the drawing. The command and address processing unit 809 processes all command instructions and/or address information given through internal signal(s) "sd in". Specifically, when the command and address processing unit 809 receives a write command (such as a Burst Data Load Start command, a Burst Data Load command or a Write Link Configuration Register command), it generates an internal signal "write" which indicates that the device 30 has entered write mode and instructs an input and output data processing unit 810 to start processing serial data input streams. On the other hand, when the command and address processing unit 809 receives a read command (such as a Burst Data Read Start command, a Burst Data Read command or a Read Status Register command), it generates an internal signal "read" which indicates that the device has entered read mode and instructs the input and output data processing unit 810 to start processing serial data output streaming through 'sd out' signal(s).

Figure 9:
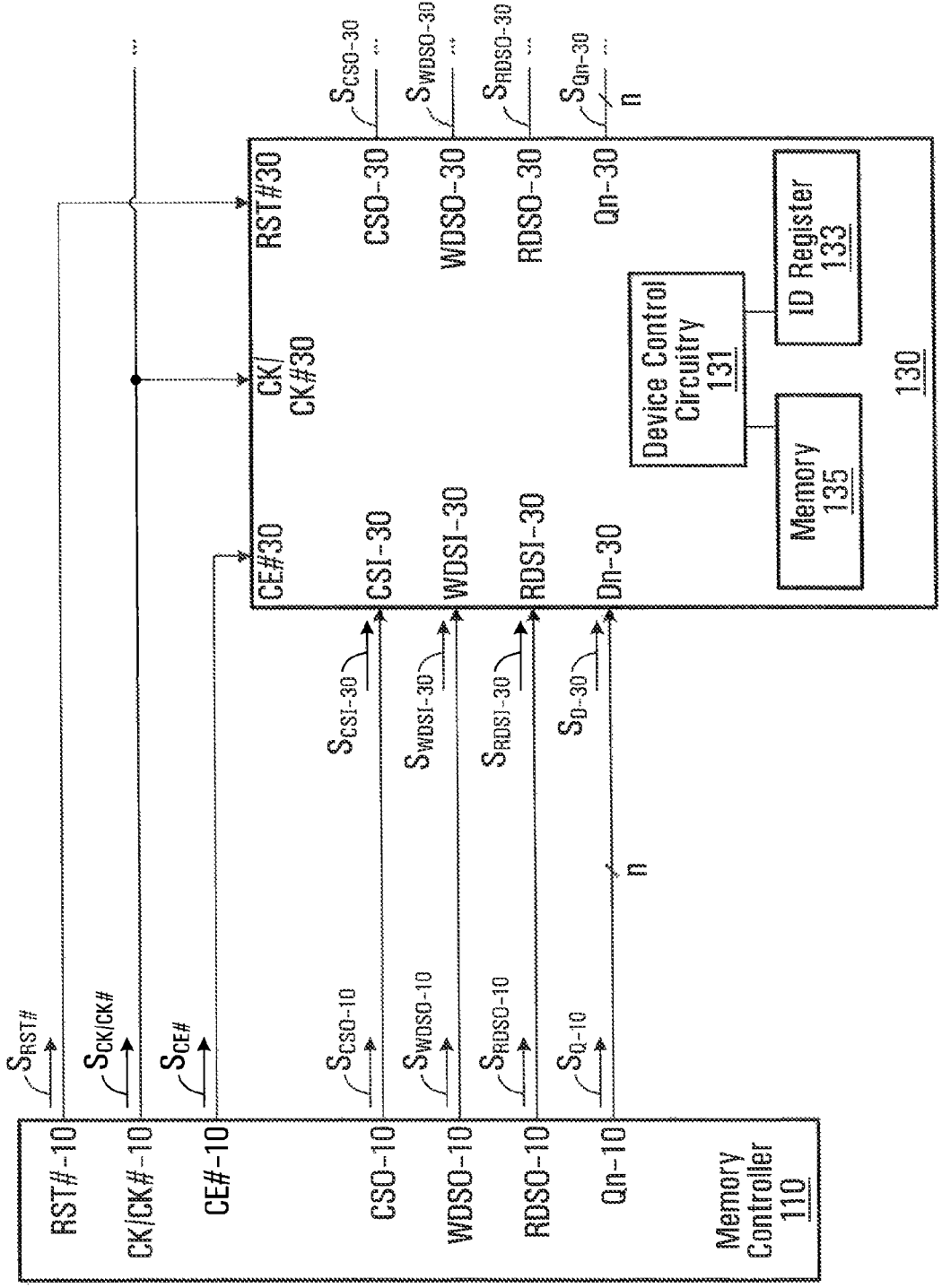
FIG. 9 shows another example of the interconnection between the memory controller and a first one of the memory devices in the chain.

FIG. 9 shows another example of the interconnection between the memory controller and a first one of the memory devices in the chain. A memory controller 110, a memory device 130 and a memory (MEM) 135 are similar to the memory controller 10, the memory device 30 and the memory 35 shown in FIG. 1A, respectively. In FIG. 9, n-bit parallel data from the memory controller 110 is transferred to the first memory device 130. Similarly, the n-bit parallel data is forwarded to the second memory device (not shown). The device control circuitry 131 writes the parallel data into the memory 135 of the memory device. Parallel data is read from the memory 135 by the device control circuitry 131 and is transferred to the second memory device. The data write and read functions are performed in response to a match between an identifier supplied by the memory controller 110 and memory device 130's assigned address identifier, which is stored in the ID register 133.

The aforementioned command/address packets (CAPs), write data packets (WDPs), read data packets (RDPs) and read data packet requests (RDPRs) can be an integral number of bytes long, regardless of the current link width (e.g., 1, 2, 4 or 8-bit width). Memory data transfers can be specified by a start address and a transfer length. The transfer length is as defined by the length of the corresponding write or read data strobe signal (WDSI or RDSI) from its rising edge to its falling edge, for example.

In view of the above description, a memory device in accordance with certain embodiments of the present invention can be seen to implement the following features:

(i) decoding/interpreting control information in response to receipt of a command/address packet (CAP) controlled by a command strobe input (CSI) signal;

(ii) operation in "write mode" to enable command sets such as "Burst Data Load Start", "Burst Data Load" and "Write Link Configuration Register";

(iii) specifically, writing of data to internal memory in response to a write data packet (WDP) controlled by a write data strobe input (WDSI) signal, when the memory device is in "write mode";

(iv) suspension and resumption capability of WDP by high and low control of write data strobe input (WDSI);

(v) operation in "read mode" to enable command sets such as "Burst Data Read" and "Read Status Register";

(vi) specifically, reading of data from internal memory in response to a read data packet request (RDPR) controlled by a read data strobe input (RDSI) signal, when the memory device is in "read mode"; and (vii) suspension and resumption capability of RDPR by high and low control of read data strobe input (RDSI).

As such, the memory system provides simplicity of bus architecture and virtually unlimited expandability of memory density. Flexible data utilization is provided by dedicated data strobe signals (WDSI for write data packet and RDSI for read data packet).

The presently proposed technique can be applied to any kind of solid state memory system such as NAND Flash electrically erasable programmable read-only memory (EEPROM), NOR Flash EEPROM, AND Flash EEPROM, DiNOR Flash EEPROM, Serial Flash EEPROM, dynamic random access memory (DRAM), static random access memory (SRAM), read-only memory (ROM), electrically programmable read-only memory (EPROM), ferroelectric random access memory (FeRAM or FRAM), magnetoresistive random access memory (MRAM) and phase change random access memory (PRAM or PCRAM), to name a few non-limiting possibilities.

In the embodiments described above, the device elements and circuits are connected to each other as shown in the figures for the sake of simplicity. In practical applications these device elements, circuits, etc., may be connected directly to each other or indirectly through other device elements, circuits, etc. Thus, in an actual configuration, the device elements, circuits, etc., are coupled either directly or indirectly with each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for execution by a memory controller connectable to a chain of serially-connected memory devices, the method comprising:

asserting a read data control signal on a first port to delimit a read data packet request (RDPR) destined for a first target memory device of the chain;

asserting a write data control signal on a second port different from the first port to delimit a write data packet (WDP) destined for a second target memory device of the chain;

the RDPR and the WDP being of different lengths.

2. The method of claim 1, further comprising:

placing data to be written to the second target memory device onto an data output port while asserting the write data control signal.

3. The method of claim 2, further comprising:

asserting a command and address control signal to delimit a first command and address packet (CAP) destined for the first target memory device, the first CAP alerting the first target memory device to the RDPR;

asserting the command and address control signal to delimit a second command and address packet (CAP) destined for the second target memory device, the second CAP alerting the second target memory device to the WDP.

4. The method of claim 3, wherein the first CAP is formulated to contain at least one of a Burst Data Read Start command, a Burst Data Read command and a Read Status Register command.

5. The method of claim 3, wherein the second CAP is formulated to contain at least one of a Burst Data Load Start command, a Burst Data Load command and a Write Link Configuration Register command.

6. The method of claim 3, further comprising:
placing command and address information destined for the first target memory device onto the data output port while asserting the command and address signal control signal to delimit the first CAP; and
placing command and address information destined for the second target memory device onto the data output port while asserting the command and address signal control signal to delimit the second CAP.

7. The method of claim 6, wherein the command and address information destined for the first target memory device comprises an identifier of the first target memory device and wherein the command and address information destined for the second target memory device comprise an identifier of the second target memory device.

8. The method of claim 1, further comprising de-asserting the read data control signal to suspend the RDPR and re-asserting the read data control signal to resume the RDPR.

9. The method of claim 8, wherein the write data control signal is asserted while the RDP is suspended.

10. The method of claim 1, further comprising de-asserting the write data control signal to suspend the WDP and re-asserting the write data control signal to resume the WDP.

11. The method of claim 10, wherein the read data control signal is asserted while the WDP is suspended.

12. The method of claim 1, further comprising producing at least one clock signal, wherein the read data control signal and the write data control signal are referenced at transition edges of the at least one clock signal.

13. The method of claim 1, further comprising:
detecting assertion of a command and address control signal received from the last memory device of the chain at a control input port of the memory controller;
receiving data from the last memory device at a data input port of the memory controller while the received command and address control signal is asserted;
the received data comprising data read form the first target memory device in response to the RDPR.

14. A method for execution by a memory controller connectable to a chain of serially-connected memory devices, the method comprising:
asserting a read data control signal to delimit a read data packet request (RDPR) destined for a first target memory device of the chain;
asserting a write data control signal to delimit a write data packet (WDP) destined for a second target memory device of the chain;
wherein the RDPR and the WDP are time interleaved with respect to one another.

15. The method of claim 14, further comprising:
placing data to be written to the second target memory device onto an data output port while asserting the write data control signal.

16. The method of claim 15, further comprising;
asserting a command and address control signal to delimit a first command and address packet (CAP) destined for the first target memory device, the first CAP alerting the first target memory device to the RDPR;
asserting the command and address control signal to delimit a second command and address packet (CAP) destined for the second target memory device, the second CAP alerting the second target memory device to the WDP.

17. The method of claim 16, wherein:
the first CAP conveys at least one of a Burst Data Read Start command, a Burst Data Read command and a Read Status Register command; and
the second CAP conveys at least one of a Burst Data Load Start command, a Burst Data Load command and a Write Link Configuration Register command.

18. The method of claim 16, further comprising:
placing command and address information destined for the first target memory device onto the data output port while asserting the command and address signal control signal to delimit the first CAP; and
placing command and address information destined for the second target memory device onto the data output port while asserting the command and address signal control signal to delimit the second CAP.

19. The method of claim 18, wherein the command and address information destined for the first target memory device comprises an identifier of the first target memory device and wherein the command and address information destined for the second target memory device comprise an identifier of the second target memory device.

20. The method of claim 14, further comprising de-asserting the read data control signal to suspend the RDPR and re-asserting the read data control signal to resume the RDPR.

21. The method of claim 20, wherein the write data control signal is asserted while the RDP is suspended.

22. The method of claim 14, further comprising de-asserting the write data control signal to suspend the WDP and re-asserting the write data control signal to resume the WDP.

23. The method of claim 22, wherein the read data control signal is asserted while the WDP is suspended.

24. The method of claim 14, further comprising producing at least one free-running clock signal, wherein the read data control signal and the write data control signal are referenced at transition edges of the at least one free-running clock signal.

25. The method of claim 14, further comprising:
detecting assertion of a command and address control signal received from the last memory device of the chain at a control input port of the memory controller;
receiving data from the last memory device at a data input port of the memory controller while the received command and address control signal is asserted;
the received data comprising data read form the first target memory device in response to the RDPR.

26. A memory device, comprising:
a first control input port;
a second control input port;
a third control input port;
a data input port;
a data output port;
an internal memory;

control circuitry responsive to a control signal on the first control input port to capture command and address information via the data input port;

wherein when the command is a read command, the control circuitry is further responsive to a read control signal on the second control input port to transfer data associated with the address information from the internal memory onto the data output port; and wherein when the command is a write command, the control circuitry is further responsive to a write control signal on the third control input port to write data captured via the data input port into the internal memory at a location associated with the address information.

27. The memory device of claim 26, wherein the command and address information comprises a command and address packet (CAP) having a stream of consecutive bytes that include device identifier bytes, command bytes and/or memory address bytes.

28. The memory device of claim 26, wherein the command bytes convey information pertaining to the command to be executed by a destination memory device, and wherein the number of bytes in the CAP depends on the command.

29. The memory device of claim 26, wherein the control circuitry is responsive to the write control signal or the read control signal if the write command or the read command is destined for the memory device.

30. The memory device of claim 26, wherein the control circuitry is further configured to extract a device identifier from the control signal on the first control input port.

31. The memory device of claim 30, wherein the control circuitry is responsive to the write control signal or the read control signal if the extracted device identifier matches an assigned identifier of the memory device.

32. The memory device of claim 26, forming part of a chain with at least one other memory device, wherein the control circuitry is configured to forward the control signal on the first control input port to a next device of the chain.

33. The memory device of claim 32, wherein when the command is a read command, the control circuitry is further configured to transfer the signal on the third control input port to the next device of the chain.

34. The memory device of claim 33, wherein the signal on the third control input port delimits a write data packet (WDP) destined for another memory device of the chain.

35. The memory device of claim 32, wherein when the command is a read command, the control circuitry is further configured to transfer the read control signal to the next device of the chain.

36. The memory device of claim 32, wherein when the command is a write command, the control circuitry is further configured to transfer the signal on the second control input port to the next device of the chain.

37. The memory device of claim 36, wherein the signal on the third control input port delimits a read data packet request (RDPR) destined for another memory device of the chain.

38. The memory device of claim 37, wherein when the command is a write command, the control circuitry is further configured to suspend transferring the write control signal to the next device of the chain.

39. The memory device of claim 26, wherein when the command is a read command, the control circuitry is further responsive to de-assertion of the read control signal to suspend transferring data from the internal memory onto the data output port.

40. The memory device of claim 39, wherein during the time when the control circuitry has suspended transferring data from the internal memory onto the data output port, the control circuitry is further configured to transfer data from the data input port to the data output port and to transfer the signals on the first, second and third control inputs to the next device of the chain.

41. The memory device of claim 40, wherein when the command is a read command, the control circuitry is further responsive to re-assertion of the read control signal to resume transferring data from the internal memory onto the data output port.

42. The memory device of claim 26, wherein when the command is a write command, the control circuitry is further responsive to de-assertion of the write control signal to suspend writing data captured via the data input port to the internal memory.

43. The memory device of claim 42, wherein during the time when the control circuitry has suspended writing data captured via the data input port to the internal memory, the control circuitry is further configured to transfer the captured data from the data input port to the data output port and to transfer the signals on the first, second and third control inputs to the next device of the chain.

44. The memory device of claim 43, wherein when the command is a write command, the control circuitry is further responsive to re-assertion of the write control signal to resume writing data captured from the data input port to the internal memory.

45. The memory device of claim 26, wherein the data input port and the data output port each include a plurality of pins for transporting data in parallel to and from the memory device.

46. The memory device of claim 26, wherein the read control signal and the write control signal are referenced at transition edges of at least one clock signal received from a memory controller.

47. The memory device of claim 26, wherein the command is at least one of a Burst Data Load Start command, a Burst Data Load command, a Write Link Configuration Register command, a Burst Data Read Start command, a Burst Data Read command and a Read Status Register command.

48. The memory device of claim 26, wherein the internal memory comprises solid state memory.

49. The memory device of claim 26, wherein the internal memory comprises semiconductor memory.

50. The memory device of claim 26, wherein the internal memory comprises at least one of volatile memory, non-volatile memory and a combination of volatile and non-volatile memory.

51. The memory device of claim 26, wherein the internal memory comprises flash memory.

52. The memory device of claim 26, comprising at least one of NAND Flash EEPROM, NOR Flash EEPROM, AND Flash EEPROM, DiNOR Flash EEPROM, Serial Flash EEPROM, DRAM, SRAM, ROM, EPROM, FRAM, MRAM and PCRAM.

53. A memory system, comprising a memory controller connected to a chain of memory devices according to claim 26.

54. A memory device connectable to a next device of a chain, comprising:
an input/output interface;
an internal memory;
control circuitry;
wherein the control circuitry is configured to recognize a command received via the interface and destined for the memory device;

wherein when the command is a read command destined for the memory device, the control circuitry is further configured to:
  respond to a read control signal received via the interface by sending data from the internal memory towards the next device via the interface; and
  transfer a write control signal received via the interface towards the next device via the interface;
wherein when the command is a write command destined for the memory device, the control circuitry is further configured to:
  respond to the write control signal by writing data captured from the interface to the internal memory; and
  transfer the read control signal received via the interface towards the next device via the interface.

* * * * *